(12) United States Patent
He et al.

(10) Patent No.: US 11,430,367 B2
(45) Date of Patent: Aug. 30, 2022

(54) DISPLAYS WITH PHOSPHORESCENT COMPONENTS

(71) Applicant: HEWLETT-PACKARD DEVELOPMENT COMPANY, L.P., Spring, TX (US)

(72) Inventors: Hui He, Fort Collins, CO (US); Hang Yan Yuen, Fort Collins, CO (US); Paul Howard Mazurkiewicz, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/754,124

(22) PCT Filed: Dec. 14, 2017

(86) PCT No.: PCT/US2017/066363
§ 371 (c)(1),
(2) Date: Apr. 6, 2020

(87) PCT Pub. No.: WO2019/117913
PCT Pub. Date: Jun. 20, 2019

(65) Prior Publication Data
US 2020/0342803 A1    Oct. 29, 2020

(51) Int. Cl.
*G09G 3/20* (2006.01)
*G09G 3/34* (2006.01)
(Continued)

(52) U.S. Cl.
CPC ............. *G09G 3/2003* (2013.01); *G09F 9/33* (2013.01); *G09G 3/3406* (2013.01);
(Continued)

(58) Field of Classification Search
CPC ............... G09G 3/2003; G09G 3/3406; G09G 2330/027; G09G 2354/00; G09G 2370/00;
(Continued)

(56) References Cited

U.S. PATENT DOCUMENTS 4,641,925 A    2/1987   Gasparaitis et al.
5,815,228 A    9/1998   Flynn
(Continued)

FOREIGN PATENT DOCUMENTS

DE    3620950 A1       8/1987
JP    61215497 A  *    9/1986

OTHER PUBLICATIONS

Development of Phosphorescent Polymers for Organic EL Displays, 2002, https://www.nhk.or.jp/strl/publica/bt/bt11/pdf/rd0011.pdf.

*Primary Examiner* — Joseph R Haley
*Assistant Examiner* — Jennifer L Zubajlo
(74) *Attorney, Agent, or Firm* — HPI Patent Department

(57) ABSTRACT

In example implementations, a display is provided. The display includes a cover lens, a phosphorescent component, a display module and a processor. The phosphorescent component is located adjacent to the cover lens. The display module is located adjacent to the phosphorescent component opposite the cover lens. The processor is communicatively coupled to the display module to cause the display module to generate a desired image that activates corresponding portions of the phosphorescent component before the display is powered down.

15 Claims, 4 Drawing Sheets

400

(51) Int. Cl.
*H01L 27/32* (2006.01)
*G09F 9/33* (2006.01)
*G02B 5/20* (2006.01)
*G02B 5/26* (2006.01)

(52) U.S. Cl.
CPC .......... *H01L 27/3239* (2013.01); *G02B 5/208* (2013.01); *G02B 5/26* (2013.01); *G09G 2330/027* (2013.01); *G09G 2354/00* (2013.01); *G09G 2370/00* (2013.01)

(58) Field of Classification Search
CPC ....... G09F 9/33; H01L 27/3239; G02B 5/208; G02B 5/26
See application file for complete search history.

(56) References Cited

U.S. PATENT DOCUMENTS

| | | |
|---|---|---|
| 9,478,182 B2 | 10/2016 | Whitehead et al. |
| 2002/0115375 A1* | 8/2002 | Koizumi ................... B44F 1/08 446/146 |
| 2005/0007389 A1* | 1/2005 | Kumamoto .......... G09G 3/3648 345/690 |
| 2005/0094391 A1* | 5/2005 | Campbell .............. G02B 23/12 362/231 |
| 2005/0201078 A1 | 9/2005 | Hannington |
| 2007/0053201 A1 | 3/2007 | Dietz et al. |
| 2009/0193243 A1* | 7/2009 | Ely ....................... G06F 1/3293 713/320 |
| 2010/0038591 A1 | 2/2010 | Matsuhisa et al. |
| 2012/0306938 A1* | 12/2012 | Guo ......................... G09G 3/36 345/102 |
| 2013/0063050 A1* | 3/2013 | Morikawa .............. G09G 3/001 315/316 |
| 2015/0365508 A1* | 12/2015 | Kwon ................... G06F 1/1658 455/566 |
| 2020/0211485 A1* | 7/2020 | Koshimizu .......... G09G 3/3406 |

* cited by examiner

DISPLAYS WITH PHOSPHORESCENT COMPONENTS

BACKGROUND

Displays can be used to generate graphical images. Displays can be used by people to consume media content. For example, televisions can broadcast television programming, movies, or any other type of media. Displays can also be used for productivity. For example, monitors can be used to display graphical images, applications, and the like.

The displays can include a variety of different components. A power source can be used to power the display and the light source within the display. A controller or a processor in the display can control what images are generated on the display. Typically, the display does not operate when disconnected from the power source.

DETAILED DESCRIPTION

Examples described herein provide displays with phosphorescent components that can display images while a device is powered down. As discussed above, displays generate, or are capable of generating, an image when connected to a power source and turned on. However, displays generally do not generate an image when the display is powered down.

In some instances, it may be desirable to have an image displayed by a display even when the display is powered down. For example, a device with a display may generate a logo, or other images or characters, while powered down for advertisement, for aesthetic appeal, and the like.

Examples herein describe a display with a phosphorescent component that can display a desired image while the device is powered down. Since the image is generated while the display is powered down, energy and/or battery power consumption is minimized.

The desired image may be customized by a user or be a pre-defined image. The phosphorescent component of the present disclosure may also include different colored phosphorescent components that can be activated by different wavelengths of light that may allow multi-colored images.

Figure 1:
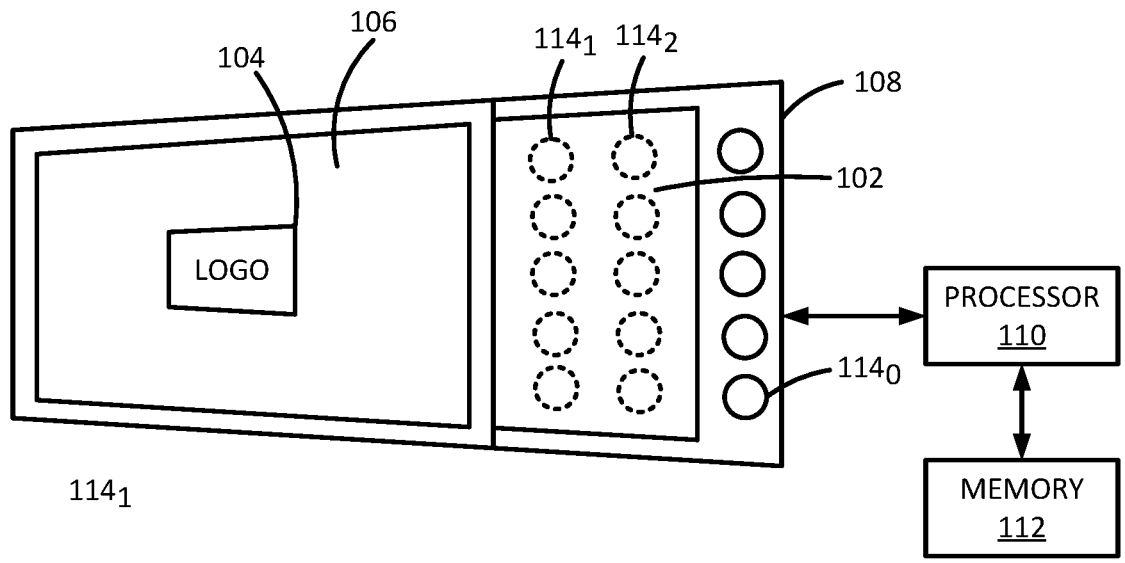
FIG. 1 is a block diagram of an example of an apparatus of the present disclosure.

FIG. 1 illustrates an apparatus 100 of the present disclosure. The apparatus 100 may be a display or a monitor. For example, the apparatus 100 may be a display that is part of a laptop computer, tablet computer or any other mobile endpoint device. The apparatus 100 may also be a stand-alone monitor. For example, the apparatus 100 may be part of a television, monitor for a desktop computer, and the like.

In one example, the apparatus 100 may include a cover lens 106, a phosphorescent component 102 and a display module 108. The cover lens 106 may be a touch screen cover lens or a non-touch screen cover lens.

The phosphorescent component 102 may be located between the cover lens 106 and the display module 108. The location of the phosphorescent component 102 may allow the desired image 104 that is generated to be more easily seen on the cover lens 106. For example, some designs may position the phosphorescent component 102 behind the display module 108 and the cover lens 106. However, such an arrangement may make it difficult to see any images generated by the phosphorescent component 102.

In addition, placing the phosphorescent component 102 between the cover lens 106 and the display module 108 may prevent the phosphorescent component 102 from being damaged during manufacturing. For example, the display module 108 could scratch or damage the phosphorescent component 102 during manufacturing if the phosphorescent component 102 is located behind the display module 108.

In one example, the phosphorescent component 102 may be formed as part of the cover lens 106. In other words, the cover lens 106 and the phosphorescent component 102 may be a single component. In one example, the phosphorescent component 102 may be part of an optically clear adhesive (OCA) (not shown) that is used to couple the cover lens 106 to the display module 108.

The phosphorescent component 102 may include phosphorescent materials that may be excited by wavelengths of light to generate a desired image 104 even when the apparatus 100 is powered down. In other words, when no power is delivered to the apparatus 100, or the device that has the apparatus 100, the apparatus 100 may still generate the desired image 104 via the phosphorescent component 102.

In one example, the phosphorescent component 102 may be comprised of phosphorescent materials such as zinc sulphite, calcium sulphite, strontium aluminate, and the like. The phosphorescent component 102 may be a thin film comprised of the phosphorescent material that is distributed on the thin film as a dot matrix. The phosphorescent material may be activated by a particular wavelength of light. When the phosphorescent material is activated, the phosphorescent material may "glow" and generate the image 104 even after the apparatus 100 is powered down.

In one example, the display module 108 may include a plurality of light sources $114_1$ to $114_o$ (hereinafter also referred to individually as a light source 114 or collectively as light sources 114). The light sources 114 may be light emitting diodes (LEDs), organic LEDs, and the like. The display module 108 may include additional light sources for generating an image when the apparatus 100 is powered on as part of a display or a monitor. In other words, the resolution of the desired image 104 that is generated when the apparatus 100 is powered down may not be the same as the resolution of an image generated by the display module 108 when the apparatus 100 is powered on.

The light sources 114 may be arranged to correspond to the matrix of phosphorescent materials in the phosphorescent component 102. For example, the size of the area covered by the light sources 114 may be equal to or larger than the dimensions of the phosphorescent component 102. The light sources 114 may be selected to emit a wavelength of light that can activate the phosphorescent material used in the phosphorescent component 102.

The apparatus 100 may also include a processor 110 and a memory 112. The processor 110 may be communicatively coupled to the memory 112 and the display module 108 to control operation of the light sources 114. The memory 112 may be any type of non-transitory computer readable storage medium such as a hard disk drive, a random access memory (RAM), a read only memory (ROM), and the like.

In one example, the processor 110 may activate certain light sources 114 that correspond to different areas of the phosphorescent component 102. The light emitted by the light sources 114 may then activate the phosphorescent materials in the desired areas of the phosphorescent component 102 to generate the image 104.

In one example, the different areas of the phosphorescent component 102 or the different light sources 114 that are activated may be a function of the desired image 104. The desired image 104 may be a logo, text, or any other type of image. The desired image 104 may be pre-defined and stored as part of a basic input/output system (BIOS) of a computing device associated with the apparatus 100. For example, the desired image 104 may be a logo of a company that manufactures the apparatus 100 that is displayed by the phosphorescent component 102 while the apparatus 100 is powered down.

In one example, the desired image 104 may be custom image selected by a user. For example, a user may customize the desired image 104 via a graphical user interface that can then be stored in the memory 112. In one example, an application may be executed to allow the user to create the desired image 104 that can be stored in the memory 112. For example, the user may design the desired image 104 and a location on the cover lens 106 where the desired image 104 should be generated. The information associated with the desired image 104 and the location may be used by the processor 110 to determine which light sources 114 should be activated. The desired image 104 may then be generated by the phosphorescent materials that are activated in the phosphorescent component 102 in the desired location and shape associated with the desired image 104.

In one example, the processor 110 may activate the particular light sources 114 in response to detecting a power down signal. For example, when a power button is pressed to power down the apparatus 100, or a device associated with the apparatus 100, a power down signal may be received by the processor 110. The processor 110 may then obtain the desired image 104 from the memory 112 and determine which lights sources 114 should be activated before powering down. The processor 110 may flash (e.g., power on and off) the particular light sources 114 associated with the location and shape of the desired image 104 before powering down. After flashing the particular light sources 114, the apparatus 100 may be powered down and the desired image 104 may be generated by the phosphorescent materials that were activated in the phosphorescent component 102.

It should be noted that FIG. 1 has been simplified for ease of explanation. The apparatus 100 may include additional components that are not shown. For example, the display module 108 may be a liquid crystal display (LCD) that includes additional components associated with an LCD display, the apparatus 100 may include interfaces for external connections, graphical processors, and the like.

Figure 2:
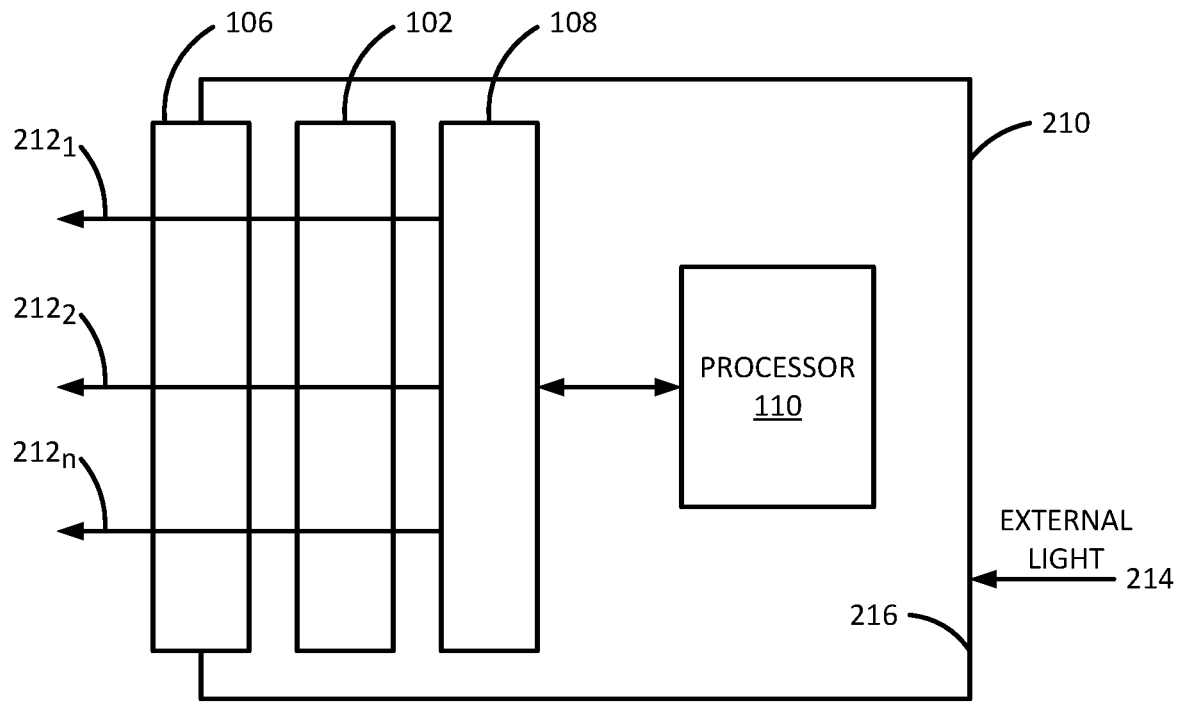
FIG. 2 is a block diagram of an example of a display in the apparatus of the present disclosure.

FIG. 2 illustrates an example cross-sectional side view of the apparatus 100. As noted above, the apparatus 100 may be a display or a monitor.

FIG. 2 illustrates the cover lens 106, the phosphorescent component 102 and the display module 108. The phosphorescent component 102 may be located adjacent to the cover lens 106. The display module 108 may be located adjacent to the phosphorescent component 102 and opposite the cover lens 106. In other words, the cover lens 106 and the display module 108 may be located on opposite sides of the phosphorescent component 102. It should be noted that the spacing between the cover lens 106, the phosphorescent component 102 and the display module 108 may not be drawn to scale.

As described above, the display module 108 may include light sources 114 that emit wavelengths of light $212_1$ to $212_n$ (hereinafter also referred to individually as a wavelength of light 212 or collectively as wavelengths of light 212) through the phosphorescent component 102 and towards the cover lens 106. As noted above, the wavelengths of light 212 may be emitted by certain light sources 114 based on the desired image 104 and a location of the desired image 104.

The processor 110 may be communicatively coupled to the display module 108 to cause the display module to generate the desired image 104. The display module 108 may activate corresponding portions of the phosphorescent component 102 by generating the desired image 104 with the appropriate light sources 114 before the apparatus 100 is powered down.

In one example, the phosphorescent component 102 and the display module 108 may be enclosed by the cover lens 106 and a housing 210. In one example, the housing 210 may be partially transparent and the display module 108 may be transparent. For example, the housing 210 may have a transmittance that is greater than 40% and the display module 108 may have a transparency near or at 100%. In another example, the housing 210 may be fully transparent and also have a transparency near or at 100%. As a result, an external light 214 may be allowed to pass through the housing 210 and the display module 108. The external light 214 may be lamplight, sunlight, and the like.

In some examples, the external light 214 may be transmitted through the housing 210 to activate the phosphorescent component 102. For example, the external light 214 may be controlled and directed through the housing 210, the display module 108, and the phosphorescent component 102 to activate the corresponding portions of the phosphorescent component 102 to generate the desired image 104.

In one example, an inside surface 216 of the housing 210 may include a reflector element or hot mirrors. For example, the hot mirror may be transparent one side, but reflective on the other side. As a result, the external light 214 may enter through an exterior side of the housing 210, but be reflected by the inside surface 216 that has the reflector element or hot mirrors. As a result, light inside of the housing 210 may be recycled and reflected back towards phosphorescent component 102, rather than being absorbed or lost otherwise.

Figure 3:
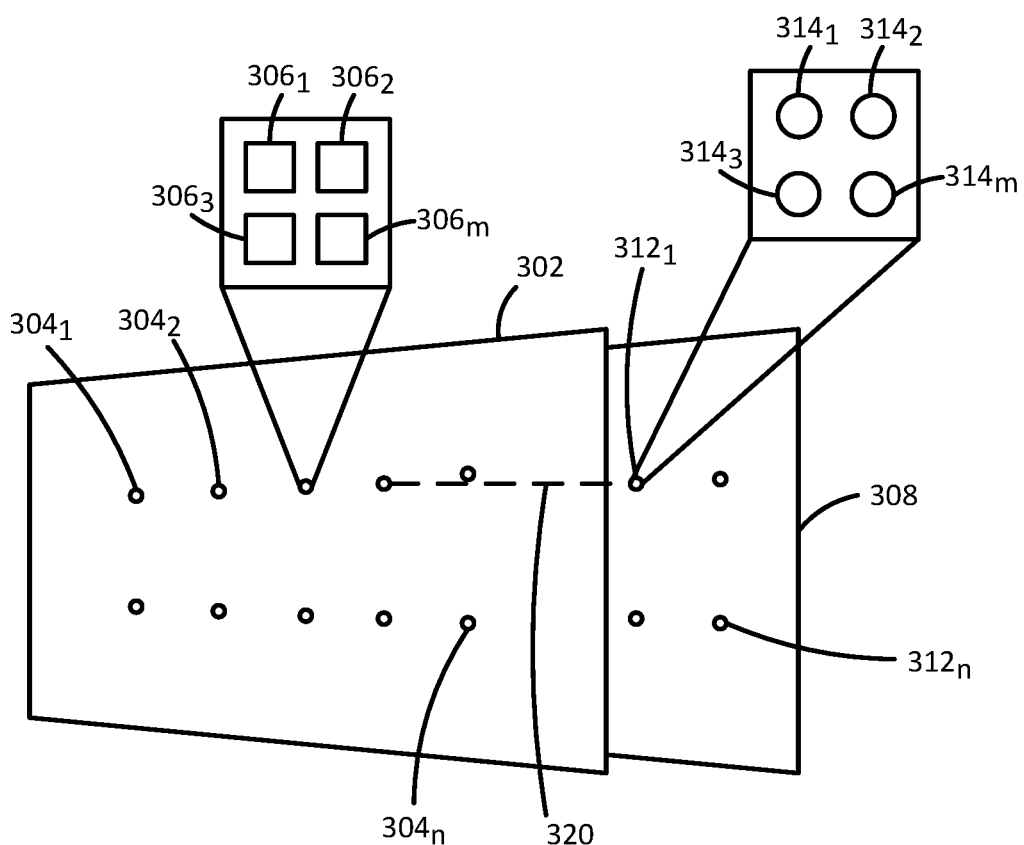
FIG. 3 illustrates a block diagram of an example of a display with different light sources that emit different wavelengths.

FIG. 3 illustrates a block diagram of an example of a display 300 having different light sources that emit different wavelengths. For example, the display 300 may generate the desired image 104 using different colors.

In one example, the display 300 may include a phosphorescent component 302 and a display module 308. The display 300 illustrated in FIG. 3 has been simplified for ease of explanation. The display 300 may include additional components not shown, such as the cover lens, housing, processor, memory, interfaces, graphical processors, and the like similar to the apparatus 100 illustrated in FIGS. 1 and 2, and described above.

In one example, the phosphorescent component 302 may include a dot film or matrix of phosphorescent materials. The phosphorescent materials may be distributed at a plurality of different locations $304_1$ to $304_n$ (hereinafter also referred to individually as a location 304 or collectively as locations 304). Each location 304 may include a plurality of different phosphorescent materials $306_1$ to $306_m$ (hereinafter also referred to collectively as phosphorescent materials 306). For example, the phosphorescent material $306_1$ may have a first color that is activated at a first wavelength of light, the phosphorescent material $306_2$ may have a second color that is activated at a second wavelength of light, the phosphorescent material $306_3$ may have a third color that is activated at a third wavelength of light, and so forth.

In one example, the display module 308 may include a plurality of light sources at different locations $312_1$ to $312_n$ (herein also referred to collectively as locations 312). Each location $312_1$ to $312_n$ may correspond to a location $304_1$ to $304_n$ of the phosphorescent component 302. In other words, the locations $304_1$ to $304_n$ of the phosphorescent component 302 may be located directly above, or on the same line as shown by dash line 320, as the locations $312_1$ to $312_n$ of the display module 308.

In one example, each location $312_1$ to $312_n$ may include a light source $314_1$ to $314_m$ (herein also referred to collectively as light sources 314). In other words, there may be the same number of different light sources that emit different wavelengths of light as there are different phosphorescent materials $306_1$ to $306_m$. The light sources 314 may be LEDs, organic LEDs, and the like.

In one example, the desired image 104 may be customized to be different colors. For example, the different colors may be selected from the colors that can be generated by the different phosphorescent materials $306_1$ to $306_m$. For example, a particular wavelength of light may excite one of the different phosphorescent materials $306_1$ to $306_m$ to generate a particular color.

In one example, the resolution of the desired image 104 having different colors may be a function of a pixel size of each location $304_1$ to $304_n$ of the phosphorescent component 302 and each location $312_1$ to $312_n$ of the display module 308. For example, the smaller the light sources 314 are, the smaller each pixel can be to generate a higher resolution desired image 104 having different colors. Moreover, the resolution of the desired image 104 that can be generated by the phosphorescent component 302 may not be the same as the resolution of an image that can be generated by the display module 308.

A processor (e.g., the processor 110) that is communicatively coupled to the display module 308 may control which light sources $314_1$ to $314_m$ are activated at each location $312_1$ to $312_n$ based on the colors of the desired image 104. For example, a pixel at location $304_1$ may be a light blue color generated by the phosphorescent material $306_1$. A light source $314_1$ may emit a first wavelength of light that activates the phosphorescent material $306_1$. A light source $314_1$ located behind the location $304_1$ may be activated to activate the phosphorescent material $306_1$ at the location $304_1$.

A pixel at location $304_2$ may be a white color generated by the phosphorescent material $306_2$. A light source $314_2$ may emit a second wavelength of light that activates the phosphorescent material $306_2$. A light source $314_2$ located behind the location $304_2$ may be activated to activate the phosphorescent material $306_2$ at the location $304_2$. The examples may be repeated for different colors generated by the phosphorescent materials $306_1$ to $306_m$ and activated by lights sources $314_1$ to $314_m$ at corresponding locations $312_1$ to $312_n$ based on the different colors and location of the desired image 104.

Figure 4:
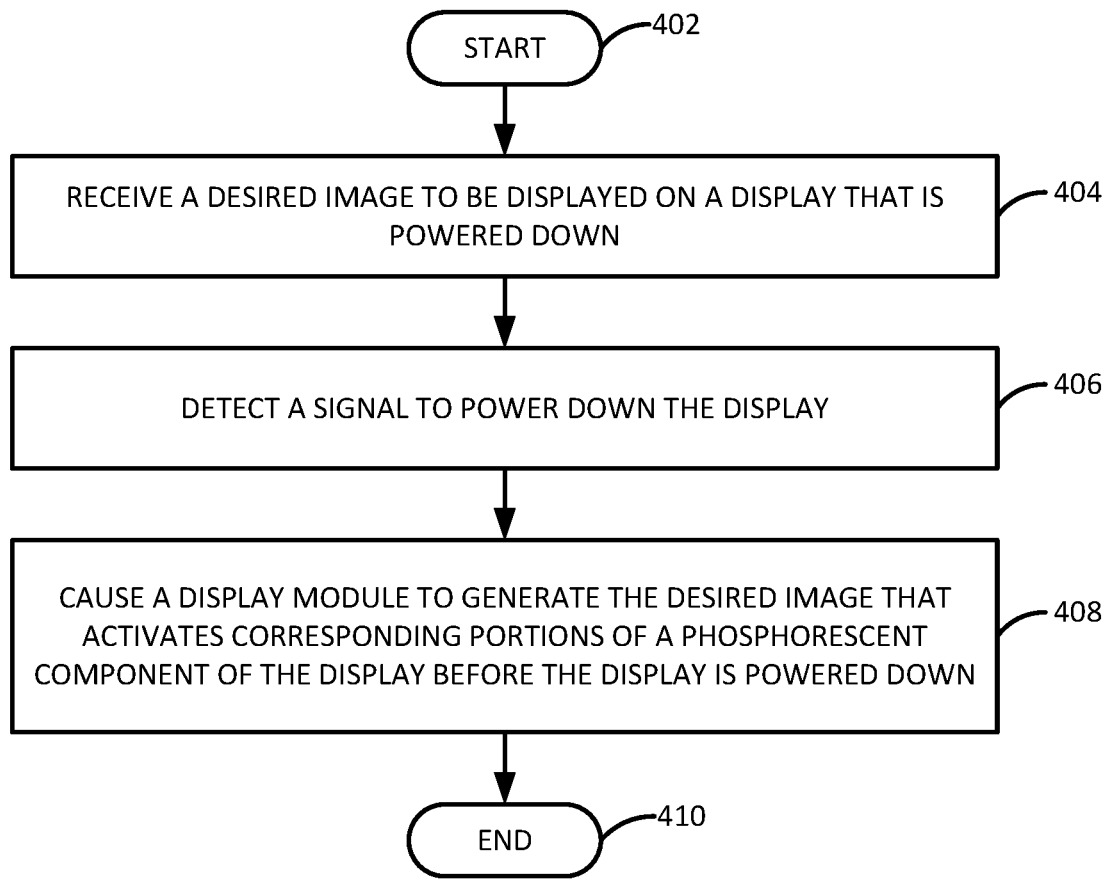
FIG. 4 is a flow chart of an example method for generating a desired image with a phosphorescent component in a display.

FIG. 4 illustrates a flow diagram of an example method 400 for generating a desired image with a phosphorescent component in a display. In one example, the method 400 may be performed by the apparatus 100, the apparatus 300, or the apparatus 500 illustrated in FIG. 5 and described below.

At block 402, the method 400 begins. At block 404, the method 400 receives a desired image to be displayed on a display that is powered down. For example, the desired image may be pre-defined and stored in memory that is part of the BIOS of a computing system associated with the display. In another example, the desired image may be customized by a user via a graphical user interface.

In one example, the desired image may be a single color for displays that have a phosphorescent component with a single type of phosphorescent material. In another example, the desired image may be multiple different colors or shades of colors for displays that have a phosphorescent component with different types of phosphorescent materials at each location of the dot film of the phosphorescent component, as described above.

At block 406, the method 400 detects a signal to power down the display. For example, a display may be deployed in a computing device or be part of a television or monitor. The computing device or monitor may be turned off by a menu selection or a physical power button. Selection of a power off option in the menus or pressing a physical power button may generate a power down signal.

At block 408, the method 400 causes a display module to generate the desired image that activates corresponding portions of a phosphorescent component of the display before the display is powered down. For example, in response to the power down signal, the desired image that is to be generated when the display is powered down may be received, or obtained, from memory.

Based on the desired image, the method 400 may determine which light sources to activate that correspond to different portions of the phosphorescent component before the display is powered down. In one example "activate" may mean to flash the selected light sources (e.g., turn on and turn off).

In one example, a particular light source may activate a particular phosphorescent material to generate a particular color. Thus, if the desired image is in different colors, then the method 400 may determine which light source of a plurality of light sources to activate at each location. For example, each location of the display module, or each pixel area of the phosphorescent component, may have a plurality of light sources that emit a different wavelength of light. Each different wavelength of light may correspond to a different phosphorescent material that generates a different color when activated by a particular wavelength of light.

After the correct light sources are activated, the display may be powered down. The phosphorescent component may generate the desired image that can be seen through the cover lens of the display even when the display is powered down.

In one example, the desired image may slowly fade over time as the phosphorescent component becomes deactivated. In one example, the display may have a timer during a power down status to periodically activate the selected light sources that cause the phosphorescent component to generate the desired image. For example, the display may still be connected to a power source and be powered down in a "sleep" mode. The display may still draw power from the power source to periodically activate the selected light sources every 2 hours, 10 hours, or any amount of time associated with the deactivation of time of the phosphorescent component. As a result, the desired image may be continuously displayed even when the display remains powered down, but still connected to a power source. At block 410, the method 400 ends.

Figure 5:
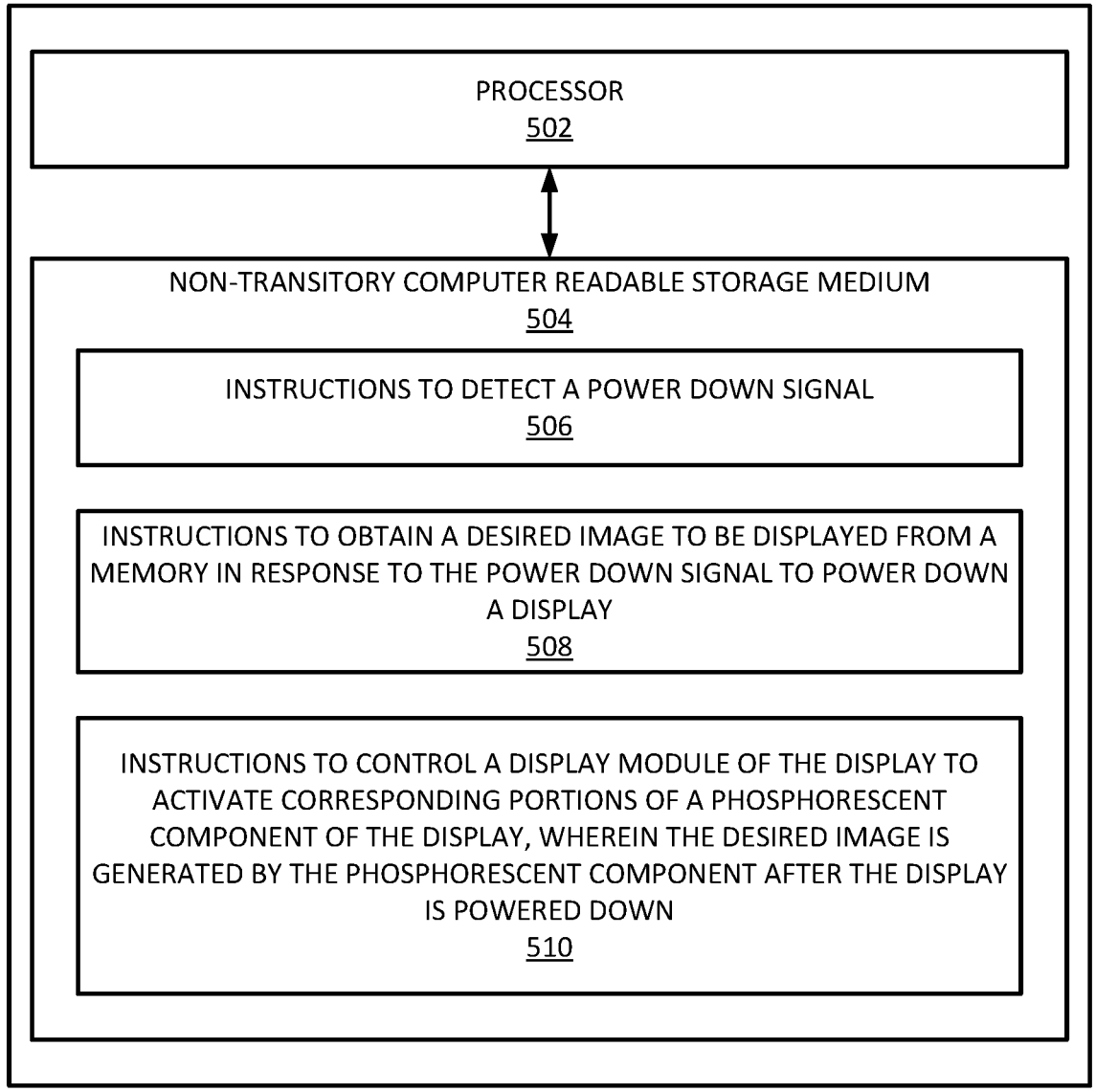
FIG. 5 is a block diagram of an example non-transitory computer readable storage medium storing instructions executed by a processor.

FIG. 5 illustrates an example of an apparatus 500. In one example, the apparatus 500 may be the apparatus 100 or the apparatus 300. In one example, the apparatus 500 may include a processor 502 and a non-transitory computer readable storage medium 504. The non-transitory computer readable storage medium 504 may include instructions 506, 508, and 510 that, when executed by the processor 502, cause the processor 502 to perform various functions.

In one example, the instructions 506 may include instructions to detect a power down signal. The instructions 508 may include instructions to obtain a desired image to be displayed from a memory in response to the power down signal to power down a display. The instructions 510 may include instructions to control a display module of the display to activate corresponding portions of a phosphorescent component of the display, wherein the desired image is generated by the phosphorescent component after the display is powered down.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A display, comprising:
   a cover lens;
   a phosphorescent component located adjacent to the cover lens;
   a display module located adjacent to the phosphorescent component opposite the cover lens;
   a processor communicatively coupled to the display module to cause the display module to generate a desired image that activates corresponding portions of the phosphorescent component before the display is powered down, wherein the phosphorescent component emits light after the display is powered down; and
   a timer to periodically activate selected light sources that cause the phosphorescent component to generate the desired image after the display is powered down.

2. The display of claim 1, wherein the phosphorescent component is part of the cover lens, wherein the phosphorescent component and the cover lens are a single component.

3. The display of claim 1, wherein the phosphorescent component is part of an optically clear adhesive used to couple the cover lens to the display module.

4. The display of claim 1, wherein the display module comprises a plurality of light sources that emit different wavelengths.

5. The display of claim 4, wherein the different wavelengths activate a respective phosphorescent material of a plurality of different phosphorescent materials associated with different colors in the phosphorescent component to generate a color of the different colors.

6. The display of claim 1, wherein the display module comprises a transparent display module.

7. The display of claim 1, further comprising:
   an enclosure coupled to the cover lens to enclose the phosphorescent component, the display module and the processor, wherein the enclosure has a transmittance that is greater than 40%.

8. The display of claim 7, wherein the enclosure comprises a hot mirror.

9. The display of claim 1, wherein the desired image is customizable.

10. A method, comprising:
    receiving, by a processor, a desired image to be displayed on a display that is powered down;
    detecting, by the processor, a signal to power down the display;
    causing, by the processor, a display module to generate the desired image that activates corresponding portions of a phosphorescent component of the display before the display is powered down, wherein the phosphorescent component emits light after the display is powered down; and
    a timer to periodically activate selected light sources that cause the phosphorescent component to generate the desired image after the display is powered down.

11. The method of claim 10, wherein the desired image is received from a user interface.

12. The method of claim 10, wherein the desired image is received from a memory of a basic input/output system (BIOS) of a computing system in communication with the display.

13. The method of claim 10, wherein the causing comprises:
    determining, by the processor, a color of a plurality of different colors for each area of the phosphorescent component that is activated; and
    activating, by the processor, a light source that emits a wavelength of light associated with the color for the each area of the phosphorescent component.

14. A non-transitory computer readable storage medium encoded with instructions executable by a processor, the non-transitory computer-readable storage medium comprising:
    instructions to detect a power down signal;
    instructions to obtain a desired image to be displayed from a memory in response to the power down signal to power down a display;
    instructions to control a display module of the display to activate corresponding portions of a phosphorescent component of the display before the display is powered down, wherein the desired image is generated by the phosphorescent component and light is emitted by the phosphorescent component after the display is powered down; and
    instructions to a timer to periodically activate selected light sources that cause the phosphorescent component to generate the desired image after the display is powered down.

15. The non-transitory computer readable storage medium of claim 14, comprising:
    instructions to determine a color of a plurality of different colors for each area of the phosphorescent component that is activated; and
    instructions to activate a light source that emits a wavelength of light associated with the color for the each area of the phosphorescent component.

* * * * *